United States Patent [19]

Alacoque

[11] Patent Number: 5,321,597
[45] Date of Patent: Jun. 14, 1994

[54] GALVANIC ISOLATION DEVICE FOR DIRECT CURRENT ELECTRICAL SIGNALS OR ELECTRICAL SIGNALS LIKELY TO INCLUDE A DIRECT CURRENT COMPONENT

[75] Inventor: Jean-Claude Alacoque, St Symphorien D'Ozon, France

[73] Assignee: Gec Alsthom SA, Paris, France

[21] Appl. No.: 135,587

[22] Filed: Oct. 13, 1993

Related U.S. Application Data

[63] Continuation of Ser. No. 854,874, Mar. 20, 1992, abandoned.

[30] Foreign Application Priority Data

Mar. 22, 1991 [FR] France ............................... 91 03508

[51] Int. Cl.$^5$ .......................................... H02M 3/337
[52] U.S. Cl. ........................................ 363/25; 363/97; 363/124
[58] Field of Search .................. 363/15, 16, 20, 21, 363/24, 25, 26, 95, 97, 124; 323/266, 282, 355

[56] References Cited

U.S. PATENT DOCUMENTS

| | | | |
|---|---|---|---|
| 3,986,097 | 10/1976 | Woods | 321/2 |
| 4,277,692 | 7/1981 | Small | 307/66 |
| 4,600,984 | 7/1986 | Cohen | 363/97 |
| 4,736,151 | 4/1988 | Dishner | 363/16 |
| 4,866,587 | 9/1989 | Wadlington . | |
| 5,029,062 | 7/1991 | Capel | 363/26 |
| 5,109,326 | 4/1992 | Martin, Jr. | 363/21 |
| 5,138,249 | 8/1992 | Capel | 323/283 |
| 5,181,169 | 1/1993 | Murugan | 363/17 |

FOREIGN PATENT DOCUMENTS 0013332 7/1980 European Pat. Off. .

OTHER PUBLICATIONS

Patent Abstracts of Japan, vol. 7, No. 33 (E-157)(1178) Feb. 9, 1983 & JP-A-57 183 267 (Hitachi Seisakusho) Nov. 11, 1982.
Elektronik, vol. 29, No. 24, Nov. 1980, Munich, pp. 91-94; Smith: "Die invers-parallele Diode von Leistungs-MOSFETs".
Wustehube "Schaltnetzteile" 1982, VDE-Verlag.
IECON'90, vol. 2, Nov. 27, 1990, Pacific Grove, pp. 1034-1040; RAVindra: "Base/gate drive suppression of inactive power devices of a voltage-fed inverter and precision synthesis of AC voltage and DC link current waves".

Primary Examiner—Steven L. Stephan
Assistant Examiner—Adolf Berhane
Attorney, Agent, or Firm—Sughrue, Mion, Zinn, Macpeak & Seas

[57] ABSTRACT

Galvanic isolation device for direct current electrical signals or electrical signals likely to include a direct current component, which includes a transformer (T), reversible switch I for chopping the incident signal applied to one wind of this transformer reversible switch I' for chopping the signal obtained at the other winding of this transformer, controlled either in phase or in phase opposition with each other and filters (F1,F2) for filtering the chopped signals respectively obtained at windings of the transformer.

14 Claims, 15 Drawing Sheets

FIG. 25

GALVANIC ISOLATION DEVICE FOR DIRECT CURRENT ELECTRICAL SIGNALS OR ELECTRICAL SIGNALS LIKELY TO INCLUDE A DIRECT CURRENT COMPONENT

This is a continuation of application Ser. No. 07/854,874 filed Mar. 20, 1992 now abandoned.

BACKGROUND OF THE INVENTION

The present invention concerns a galvanic isolation device.

There are many requirements for galvanic isolation. They are dictated by various considerations:

functional considerations such as the need to carry out measurements at potentials different than that of the processing electronics within a complex system, safety of persons: floating neutral, electrical supply availability: impedance grounded neutral, safety of persons and equipment: high common mode rejection due to atmospherically generated overvoltages or to work on distribution lines, safe operation: rejection of common mode voltages and currents in the high throughput transmission of binary data.

These requirements are usually well met by current solutions essentially based on the magnetic circuit of a voltage or current transformer or on optical fibre technology.

The transformer is a known and simple means of obtaining galvanic isolation of an alternating current signal referred to a potential which can have any value but which is usually ground potential, a frame ground potential or a fixed potential.

The alternating current signal to be isolated may convey electrical energy from a generator to a receiver or data or energy and data simultaneously.

The transformer is rated for a given frequency or for a frequency band but has the disadvantage that it is not of itself able to transmit a direct current signal and the quality of its operation at low frequencies is generally limited by its dimensions.

The transformer has the advantage of being reversible, however, and of enabling electrical energy to flow in both directions, in other words from either winding to the other in the case of a transformer with two windings.

Also, it accommodates any type of receiver: inductive, capacitive or resistive, which means that it caters for any type of current/voltage phase difference and, for each polarity of an alternating current voltage applied to it, an instantaneous current in any direction and depending in practice only on the load.

Finally, provided that it is adequately rated, it preserves the incident electrical waveform. Thus an alternating current voltage amplitude modulated by a signal conveying data can be transmitted without significant distortion from one winding to the other using the magnetic coupling between the two windings.

Another known way to isolate two electrical circuits is to convert the electrical signal to an electromagnetic signal and then to carry out the reverse conversion.

The intermediate data medium is an electromagnetic wave of higher frequency than the incident electrical signal and which can be in the radio frequency domain or in the domain of visible or invisible light. The electromagnetic wave may be free or guided (by an optical fibre, for example).

The drawback of this method is that it provides no simple and economical way of transporting significant energy to power (for example) a complete electronic system for converting the electromagnetic signal into an electrical signal and then amplifying the resulting electrical signal. Also, a direct current signal can only be transmitted with some uncertainty as to its level, given temperature and time drift in the electrical, electromagnetic and electromagnetic/electrical conversion yield and variation in losses in the transmission medium. To alleviate this drawback a direct current signal must undergo frequency conversion.

As shown in FIG. 1, it is also possible to associate with a transformer 1 an electronic switching circuit ("chopper") 2 and rectifier and filter circuits 3 enabling a direct current signal conveying energy to be transferred from the primary of the transformer to the secondary.

This amounts to frequency conversion in the energy domain.

Any data that may be superimposed on the direct current signal is then simultaneously sampled—in the digital signal processing sense—by the chopper and reconstituted by the rectifier/filter provided that the switching/sampling frequency is at least twice the highest frequency to be transmitted in the frequency spectrum of the signal conveying the data (SHANNON's theorem).

The chopper which chops the direct current signal and samples any superimposed data signal can use components of any technology: GTO thyristors, MOS or bipolar transistors, IGBT, vibrators, etc.

The combination of the chopper and the transformer can also use any available technique: forward, push-pull, flyback, resonant or non-resonant.

Depending on which technique is used, the transformer may or may not have an additional auxiliary demagnetisation winding.

This principle can achieve electrical isolation of a signal:

carrying energy or not, for example to supply power to downstream circuits, carrying data or not, having a transmit frequency spectrum extending from zero frequency (direct current) to half the switching-/sampling frequency.

Note, however, that the electronic switches used in the chopper are not reversible, that is to say that they cannot chop a current flowing in the opposite direction. If the component enables the reverse flow of current (asymmetric thyristors, MOS transistors, etc) they cannot block it (reverse-bias diodes). Where these components allow simultaneously reverse current flow and blocking of the current, performance is usually very much reduced, as in the case of the bipolar transistor. What is more, the rectifier diode(s) connected to the transformer secondary winding determine a particular direction for the secondary current. These two considerations imply a given direction of the voltage and the current at the primary and at the secondary, ruling out the use of this principle in respect of a voltage whose polarity changes with time; this is a first limitation.

A second limitation results from the fact that the chopper is on one side of the transformer and the rectifier-filter on the other side. This arrangement determines a direction of energy flow as it requires control of the magnetizing current of the transformer on the same side as the chopper, which is associated with the supply.

The use of this principle therefore introduces a two-fold lack of symmetry, in respect of:
the polarity of the voltage and the current,
the direction of energy flow.

There are therefore situations in which no acceptable solution has been found to the problem of galvanic isolation, for the theoretical or technological reasons explained above; this applies when the galvanic isolation must cater for direct current electrical signals or electrical signals likely to include a direct current component and must further be symmetrical with regard to the direction of energy flow, in other words reversible; this is a fortiori the case where the galvanic isolation must also be symmetrical with regard to the polarity of the applied signal.

The techniques outlined above provide no economical means of achieving, for example, electrical isolation of analog or digital telecommunication terminals receiving a remote power feed, and in particular rule out simultaneous implementation of the following functions:

transmission of energy by direct current or at 50 Hz (or 60 Hz) or at 50 Hz (or 60 Hz) superimposed on a direct current, two-way transmission of data in a wide frequency band: from direct current to frequencies of several hundred kilohertz, for digital transmission at 144 kbauds or from direct current up to 12 kHz, 36 kHz or even 60 kHz for analog transmission, polarity changes at the isolation input transferrable to the output in the case of a 50 Hz or 60 Hz ringing current, alone or superimposed on a direct current signal whose amplitude is below the peak voltage of the 50 or 60 Hz signal in the case of an analog link; this change of polarity may be the simple interchanging of the two non-dedicated and non-polarized DC power wires in the case of an analog or digital link, reversibility of the instantaneous direction of power flow at 50 or 60 Hz in an analog terminal calling phase to enable operation on any type of load, especially a capacitive load, and thus to authorize the exchange of reactive energy between the load and the supply, remote power feed to the electrical circuits of the isolating system itself; for this the efficiency of the isolation must be excellent, especially on standby.

SUMMARY OF THE INVENTION

An object of the present invention is to achieve the objectives mentioned hereinabove.

The present invention consists in a galvanic isolation device for direct current electrical signals or electrical signals likely to include a direct current component essentially characterized in that it comprises a transformer, reversible means for chopping the incident signal applied to one winding of said transformer, reversible means for chopping the signal obtained across the other winding of said transformer controlled in phase or in phase opposition with the previous means, and means for filtering chopped signals obtained in this way at the other winding.

According to one feature of the invention the device is reversible and comprises reversible switching means and filter means associated with each winding.

According to another feature of the invention said reversible switching means comprise semiconductor switches.

Other objects and features of the present invention will emerge from the following description of embodiments of the invention given by way of example with reference to the appended drawings in which, in addition to FIG. 1 already, described and relating to the prior art:

DETAILED DESCRIPTION OF THE PREFERRED EMBODIMENT

Figure 1:
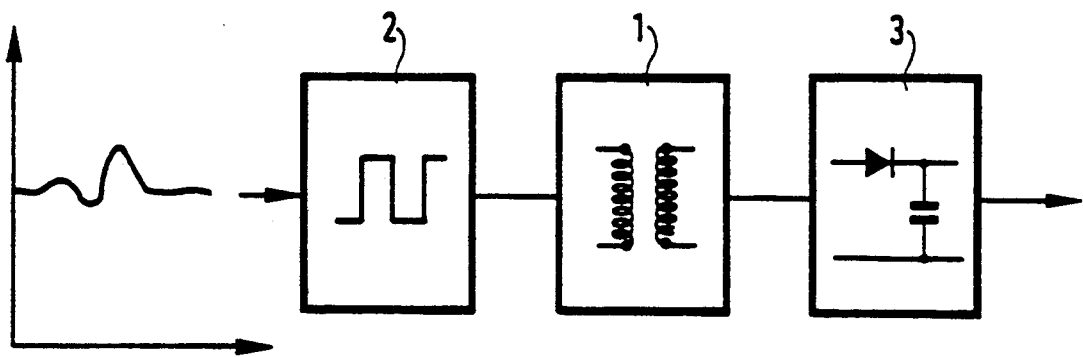
FIG. 1 illustrates a galvanic isolation device according to the prior art.
Figure 2:
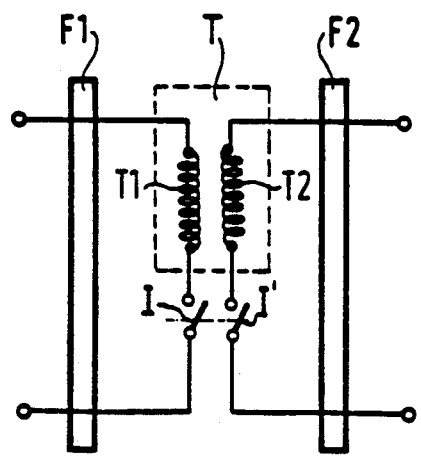
FIGS. 2 and 3 are circuit diagrams of a reversible galvanic isolation device in accordance with the invention shown in two respective operating modes.
Figure 3:
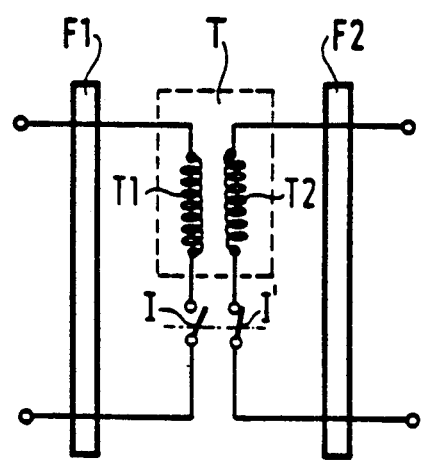

The galvanic isolating device shown in FIGS. 2 and 3 is reversible and comprises, a transformer T with respect to which its structure is symmetrical, the components included in the circuit of one winding of the transformer, the lefthand winding $T_1$, for example, for which the subscript 1 is used hereinafter, and the components in the circuit of the other winding, in this instance the righthand winding $T_2$, with the suffix 2. The functions of these components will now be explained for a given direction of signal propagation, from left to right, for example.

To provide a wide bandwidth for direct current up to frequencies of several hundred kilohertz the device includes reversible means for chopping the incident signal applied to the winding $T_1$ symbolically represented by a switch I and means for chopping the signal obtained at the winding $T_2$ symbolically represented by a switch I' which is operated at the same frequency as the switch I and either in phase therewith (so that the two switches are open or closed at the same time) which represents a mode of operation shown in FIG. 2 or in phase opposition thereto (so that one switch is closed while the other is open and vice versa) which represents the mode of operation shown in FIG. 3.

The device further comprises means $F_2$ for filtering the switched signal obtained at the winding $T_2$ in order to reconstitute an unchopped signal.

A comparable description could be given for the other direction of signal propagation, from right to left, with the reversible chopper means I', I and filter means $F_1$.

In either case, if the switches I and I' are operated simultaneously the direct current component and/or the alternating current component of the signal are transferred while the switches are closed. If the switches I and I' are operated alternately the direct current component and/or the alternating current component of the signal are transferred to the magnetic circuit of the transformer when one of the switches is closed (the switch I if the energy is flowing from left to right in the previous Figure, I' otherwise) in the form of a magnetic field and then producing an electrical signal when the other switch is closed (I' if the energy flow is from left to right in the preceding figure, I otherwise).

The magnetic circuit may be laminated or of magnetic ferrite or simply consist of the magnetic field coupling the two windings in air.

No direction of coupling of the transformer windings is shown in the Figure because this has no effect on operation. This remains exactly the same apart from reversing of the voltage, which often has no repercussions, especially in telephone installations in which the conductors are not separately identified. Note that for identical couplings of the transformer the output voltage of the FIG. 3 circuit diagram is reversed relative to that of the FIG. 2 circuit diagram.

This basic operation is not altered by the use of resonance which considerably reduces switching losses in the semiconductors constituting the electronic switches I, I'. This resonance is achieved by adding respective capacitors $C_1$ and $C_2$ and possibly respective inductors $L_1$ and $L_2$ to the FIGS. 2 and 3 circuit diagrams to yield the FIGS. 4 and 5 circuit diagrams, for example, in which the filter means $F_1$ and $F_2$ are formed by inductors $LR_1$ and $LR_2$ for differential rejection of the chopping frequency.

In the first case (FIG. 4) the resonance occurs in the series circuit C1, L1, L2, C2 and therefore essentially in the leakage inductances of the transformer, with additional external inductors if necessary, while in the second case (FIG. 5) two resonant circuits are formed each with capacitors C1, C2 and the respective magnetizing magnetic field, alternately.

In the first case one of the two inductors L1 or L2 or both inductors may be eliminated and provided by the leakage inductances of the transformer if these are sufficient for the application. The capacitors C1 and C2 are capacitors for tuning the resonant frequency.

Figure 4:
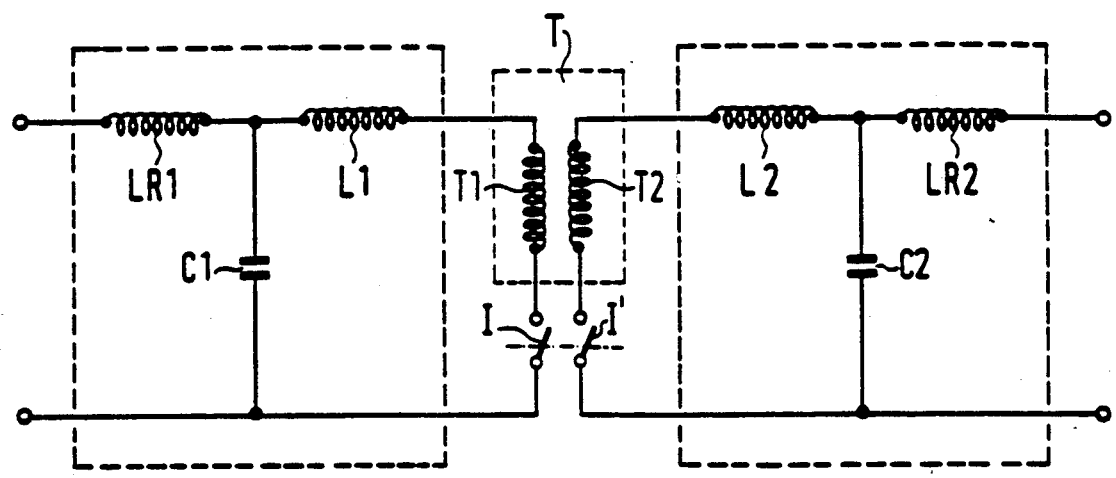
FIGS. 4 and 5 are circuit diagrams of a device in accordance with the invention shown in the operating modes of FIGS. 2 and 3, respectively, and using resonance to reduce switching losses in the semiconductors constituting the electronic switches of this device.
Figure 5:
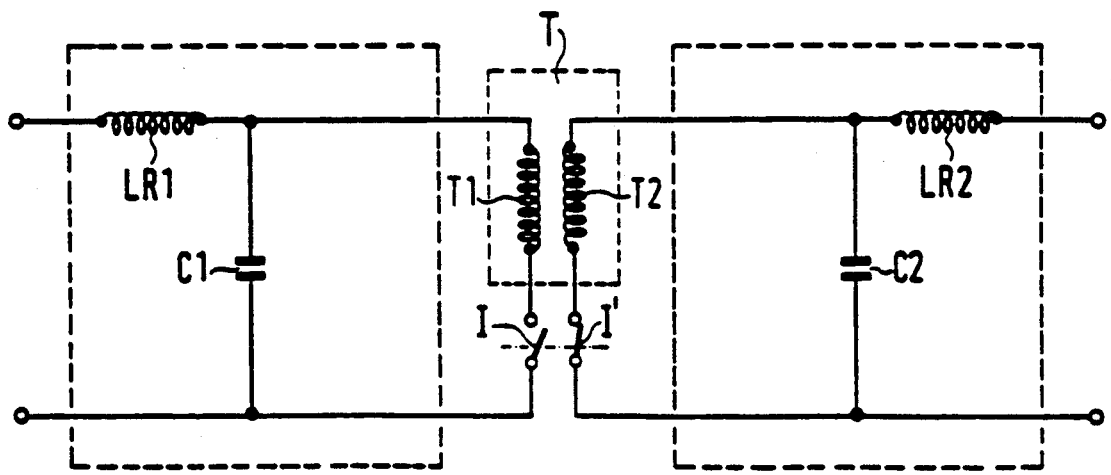
Figure 6:
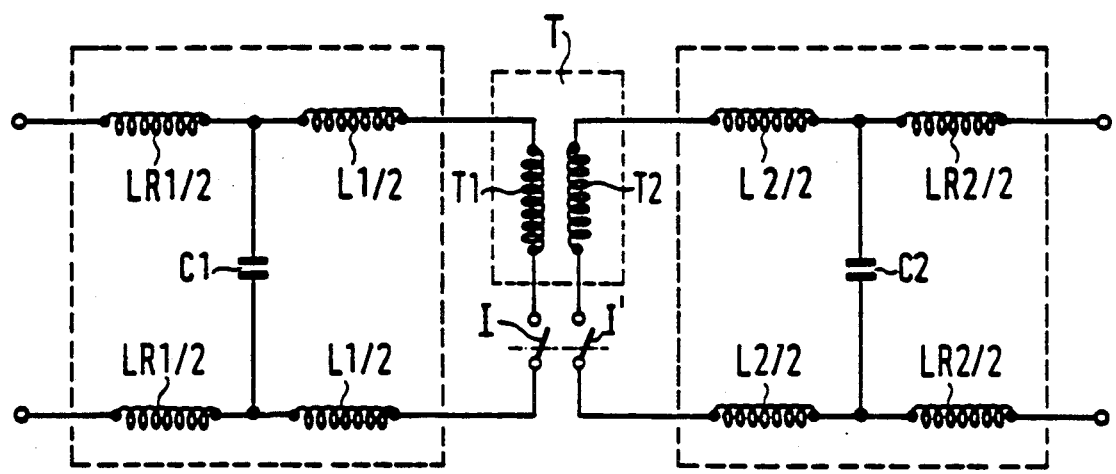
FIGS. 6 and 7 are variants of the FIGS. 4 and 5 circuit diagrams in which the components in the circuits associated with each winding of the transformer have a particular arrangement whereby each circuit has a symmetrical structure.
Figure 7:
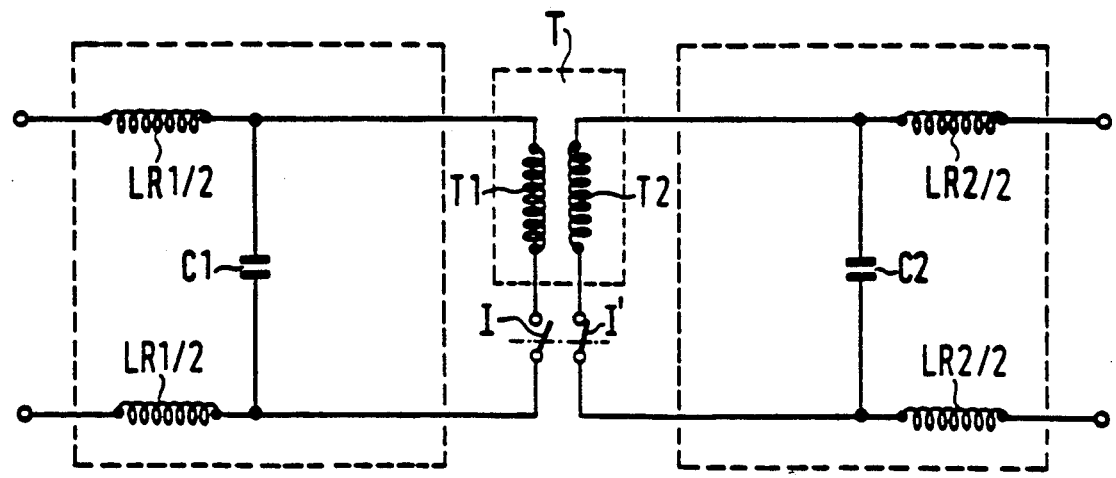

The position of LR1 (or LR2) at one terminal of the circuit diagram does not favor either polarity because operation remains the same if LR1 (or LR2) is divided between two inductors of half the value in series with each of the connections, respectively LR1/2 and LR2/2 as shown in the FIGS. 6 and 7 circuit diagrams which respectively relate to the FIGS. 4 and 5 circuit diagrams.

This arrangement is preferably adopted in telephone applications so that each wire is balanced with respect to ground and so that the appearance of a differential mode in the case of common mode induction is prevented. The same goes for L1 and L2. The two capacitors C1 and C2 are generally identical if the transformer has a unity transformer ratio. If the galvanic isolating device is also used to match the voltage or the impedance, the transformer ratio may be different than unity and the capacitors may be chosen such that their values referred to the same side of the transformer are identical. Thus if n denotes the transformer ratio from T1 to T2 (n=n2/n1) it is possible to choose C1 and C2 such that: $C1/C2 = n^2$.

Note that in the four cases described so far the symmetry of the circuit diagram is such that it is not possible to define a favored direction of energy transfer or to particularize a "primary" or a "secondary".

Likewise, if the electronic switches themselves are reversible in terms of current/voltage, no preferred polarity can be defined at either side of the circuit diagram.

Embodiments of reversible switches will now be described.

Figure 8:
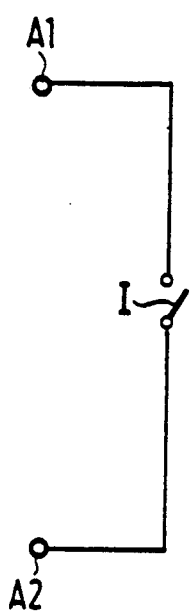
Figure 9:
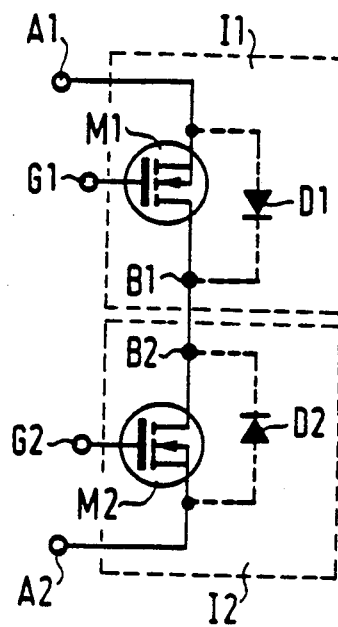
FIGS. 9 and 10 show two embodiments of a switch (represented symbolically in FIG. 8) which is reversible and uses two N-channel MOS transistors and their internal parasitic diodes in a series arrangement.
Figure 10:
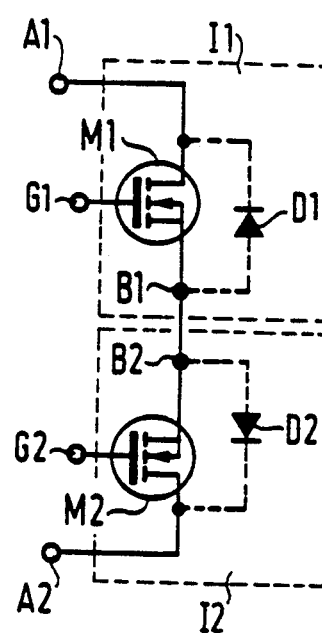
Figure 11:
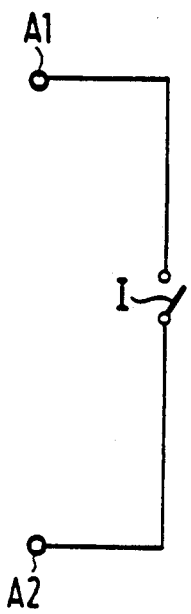
Figure 12:
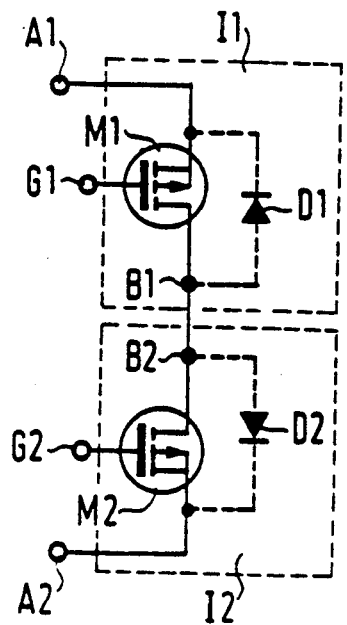
FIGS. 12 and 13 show two embodiments of a switch (represented symbolically in FIG. 11) which is reversible and uses two P-channel MOS transistors and their internal parasitic diodes in a series arrangement.
Figure 13:
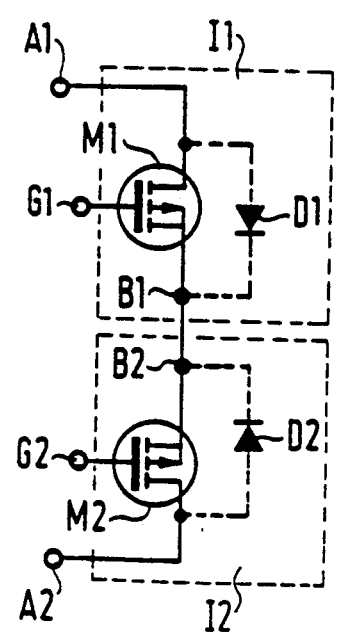

A first embodiment of a reversible switch uses two MOS transistors and their internal parasitic diodes in a series circuit shown by way of example in FIGS. 9 and 10 in the case of N-channel MOS transistors or in FIGS. 12 and 13 in the case of P-channel MOS transistors (in each case the symbolic representation of the switch is also shown, in FIGS. 8 and 11 respectively).

In the FIG. 9 circuit diagram, for example, with the source of each transistor M1 and M2 connected to a respective terminal A1 and A2 of the switch, when the terminal A1 is positive relative to the terminal A2 the parasitic diode D1 of the transistor M1 conducts and the voltage is applied to the transistor M2 which is turned on (conducts current in the drain-source direction) if the voltage at the gate G2 of the transistor M2 is positive relative to the terminal A2 and greater than the terminal threshold or is turned off (blocks the current) if the voltage at the gate G2 relative to the terminal A2 is below the turn on threshold.

If the terminal A2 is positive relative to the terminal A1 the operation is symmetrical and the current flowing through the parasitic diode D2 of the transistor M2 flows through transistor M1 from the drain to the source if the voltage between the gate G1 of the transistor M1 and the terminal A1 is greater than the turn on threshold.

In the FIG. 10 circuit diagram in which the drain of each transistor M1 and M2 is connected to the respective terminal A1 and A2 of the switch a similar result is achieved on substituting the voltage at gate G2 relative to terminal A2 for the voltage at gate G1 relative to terminal B1 and the voltage at gate G1 relative to terminal A2 for the voltage at gate G2 relative to terminal B2, on the one hand, and interchanging the roles of the diodes D1 and D2 and the transistors M1 and M2, on the other hand.

The gates G1 and G2 may be controlled simultaneously if the polarity applied between terminals A1 and A2 is not known beforehand. The flow of current between terminals A1 and A2 is then the direct result of the polarity applied between terminals A1 and A2.

Note that the gates G1 and G2 are not at the same control potential since in the first case (FIG. 9), for example, the gate G1 is controlled relative to the terminal A1 and the gate G2 relative to the terminal A2. The MOS transistor control connections can embody known galvanic isolators such as pulse transformers or optocouplers, for example.

P-channel MOS transistors can be utilized in the same way to implement the reversible switch as shown in FIGS. 12 and 13 circuit diagrams.

In FIG. 12, for example, operation is similar because, for example, when terminal A1 is positive relative to terminal A2 the parasitic diode D2 of the transistor M2 conducts the current flowing through the transistor M1 when the potential at gate G1 relative to terminal A1 is negative and exceeds in absolute value the turn on threshold. In this case also the gates G1 and G2 may be controlled synchronously and they are also referred to different potentials.

For high operating frequencies the parasitic diodes may not be fast enough or may have an excessively high reverse current. In such cases it is possible to eliminate the operation of the internal parasitic diodes by connecting in series with each transistor a diode DS having the required speed characteristics and then connecting in parallel with this combination a second, similar diode DP as a substitute for the parasitic diode.

Figure 14:
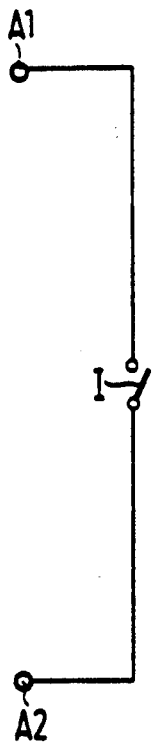
Figure 15:
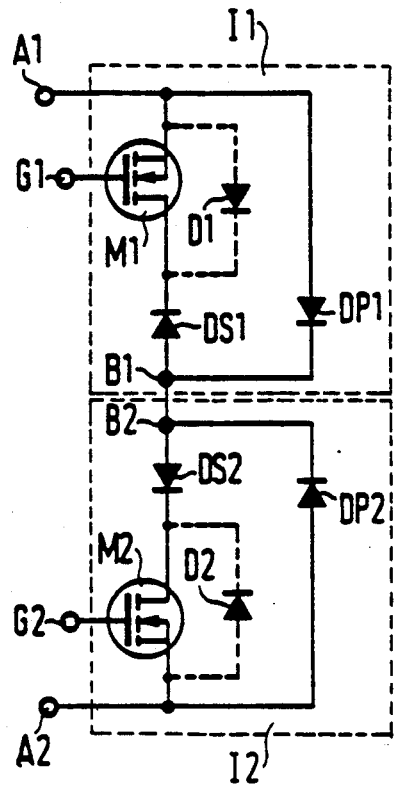
FIGS. 15, 16, 17 and 18 show variants of the FIGS. 9, 10, 12 and 13 circuit diagrams for high operating frequencies.
Figure 16:
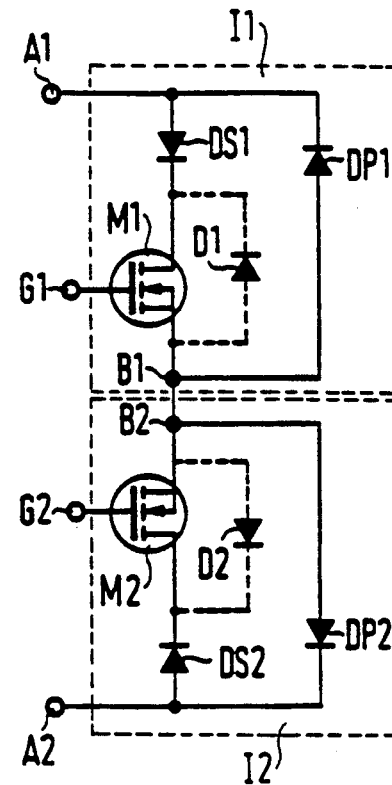
Figure 17:
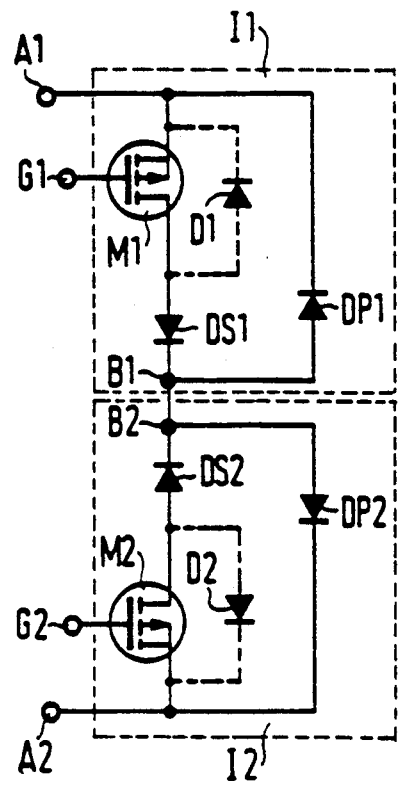
Figure 18:
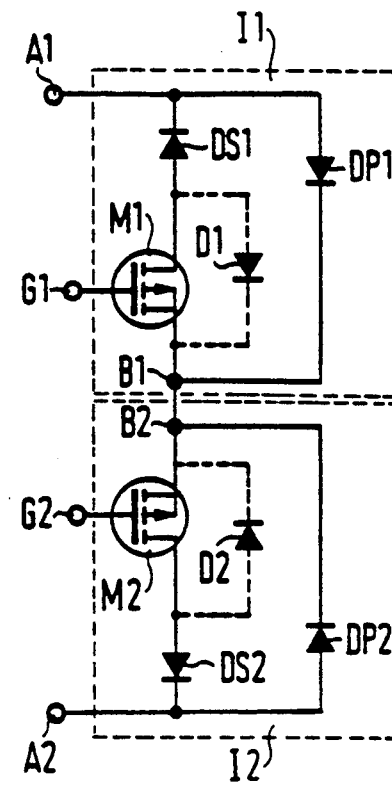

The resulting circuit diagrams are shown in FIGS. 15 and 16 for N-channel MOS transistors and FIGS. 17 and 18 for P-channel MOS transistors, the switch being also represented symbolically in FIG. 14. Once again, G1 and G2 may be controlled simultaneously.

Note that all the previous circuit diagrams have a horizontal axis of symmetry. This property can be exploited to enhance the symmetry of the FIGS. 2, 3, 4, 5, 6 and 7 circuit diagrams by splitting each of the switches I1, I2 into respective basic switches called half-switches I11, I21 and I12, I22 disposed one on each side of the respective transformer winding. Whether operation uses resonance or not and whether the switches are controlled synchronously or alternately the resulting general arrangement is that shown in FIG. 19 in which the circuits denoted R1 and R2 denote all the circuits needed to achieve resonance, if used, and/or filtering.

Figure 20:
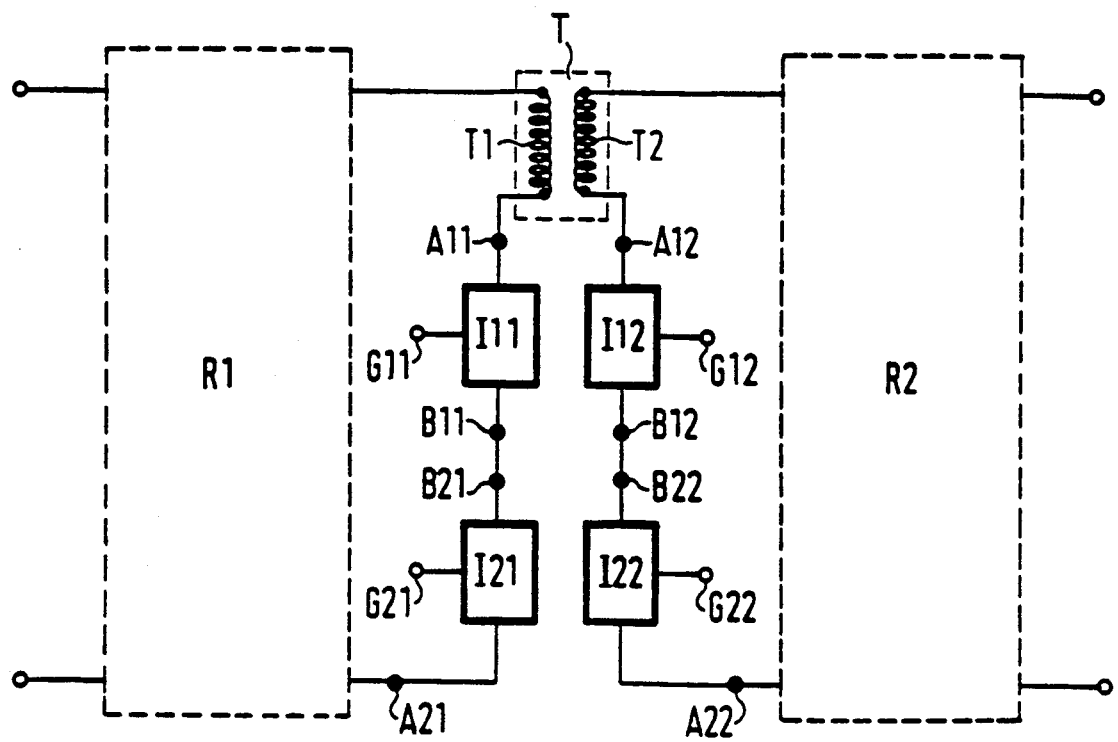
FIG. 20 shows a variant of the FIG. 19 circuit diagram, FIGS. 21 and 22 on the one hand and FIGS. 23 and 24 on the other hand are timing diagrams showing two control modes of four basic switches referred to as half-switches used in the circuit diagrams of FIGS. 19 and 20, FIGS. 26 through 29 show variants of a switch (shown symbolically in FIG. 25) which is reversible and uses MOS transistors in an anti-parallel arrangement.

Although this arrangement is beneficial with regard to the symmetry of the circuits with respect to ground (or frame ground) this is not necessarily so in respect of its operation, as explained above. This remains unchanged in the arrangement shown in FIG. 20 which does not have any symmetry with respect to a horizontal axis.

Figure 21:
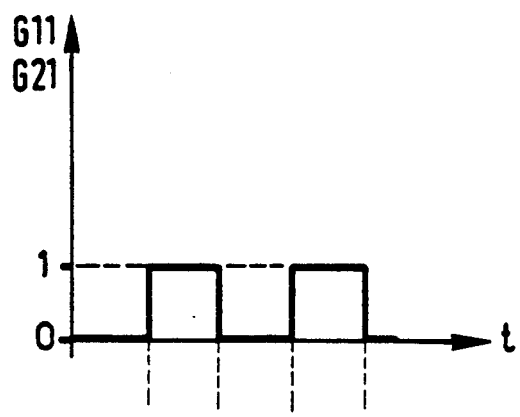
Figure 23:
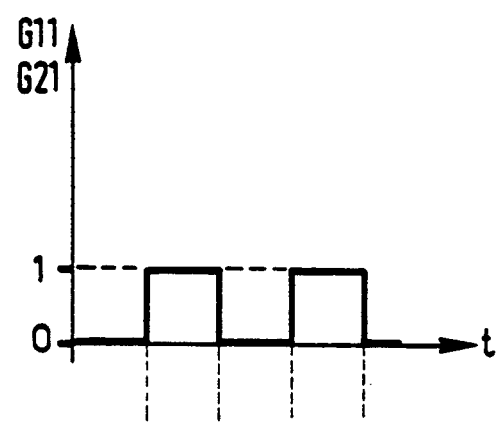
Figure 22:
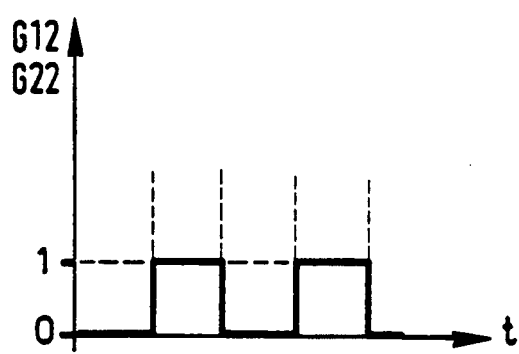
Figure 24:
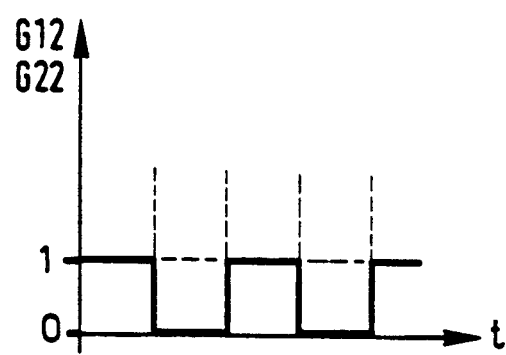

For the previous two arrangements the gates G11, G21, G12, G22 of the four half-switches can be controlled at the same time, as shown in the FIGS. 21 and 22 timing diagrams, or the G11, G21 group can be controlled synchronously and the G12, G22 group can be controlled synchronously, as shown in the FIGS. 23 and 24 timing diagrams, each of the two groups being in phase opposition to the other.

It is also possible to implement a reversible switch with an anti-parallel arrangement of the MOS transistors M1 and M2. Depending on the type of MOS transistor employed, this yields the circuit diagram of FIGS. 26, 27, 28 or 29, FIG. 25 showing the symbolic representation of the switch.

Each branch of these circuits comprises, in addition to one of the transistors M1, M2, a respective diode DS1, DS2 in series with the transistor and adapted to block the current in this branch for one polarity of the applied voltage for which the respective internal parasitic diode D1, D2 of the transistor in question conducts.

The relative arrangement of DSj and Mj (j=1, 2) in the same branch may be interchanged without changing the operation.

Figure 27:
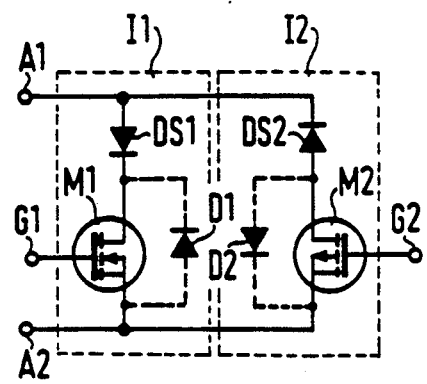
Figure 28:
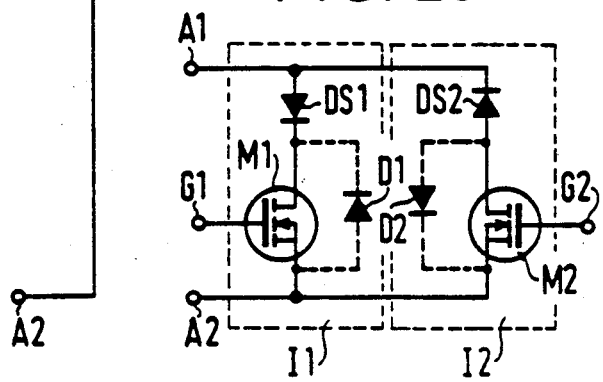

The advantage of the FIGS. 27 and 28 circuit diagrams, in which both transistors M1 and M2 have their source connected to a common switch terminal, in this example the terminal A2, lies in the fact that the reference potential for controlling G1 and G2 is the same, in this instance the potential at A2, which can be exploited to simplify the transistor control electronics.

Once again, G1 and G2 may be controlled simultaneously and in this case the direction of the current will result from the polarity of the applied voltage, or control of one of the two half-switches can be chosen according to the measured direction of the voltage applied to the complete switch.

Figure 30:
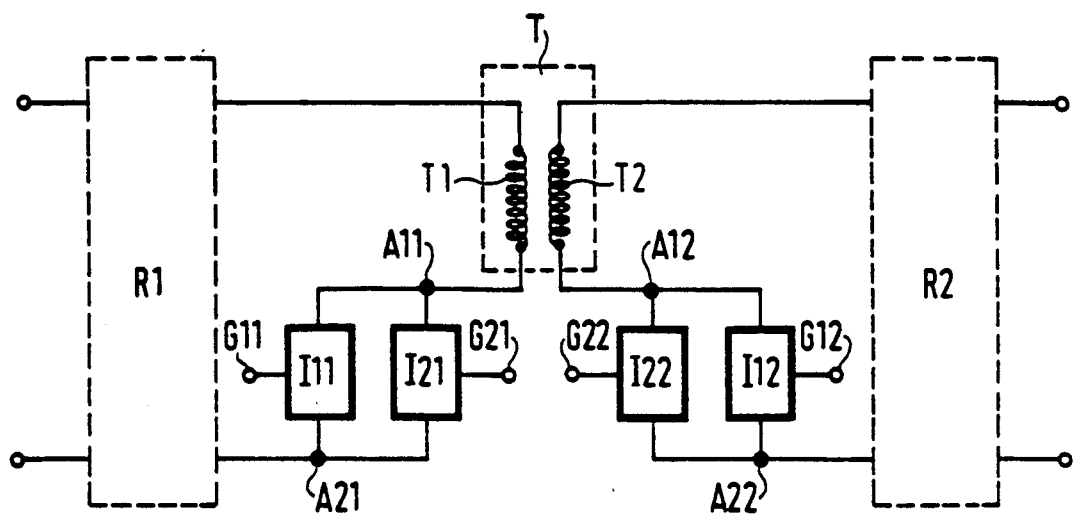
FIG. 30 shows a variant of the circuit diagrams of FIGS. 2 through 7 with reversible switches in the embodiment of FIGS. 26 through 29, FIGS. 31 and 32 are circuit diagrams of a galvanic isolation device in accordance with the invention including the control components of its four half-switches.

In the same manner as in the case of half-switches connected in series, connecting the half-switches in an anti-parallel arrangement yields the general circuit diagram of a galvanic isolation device shown in FIG. 30.

Also in the same manner as in the case of half-switches connected in series, G11, G21, G12, G22 can be controlled at the same time, as shown in the FIG. 21 and 22 timing diagrams, or the G11, G21 group may be controlled synchronously and the G12, G22 group may be controlled synchronously, each of the two groups being in phase opposition relative to the other, as shown in the FIGS. 23 and 24 timing diagrams.

Figure 19:
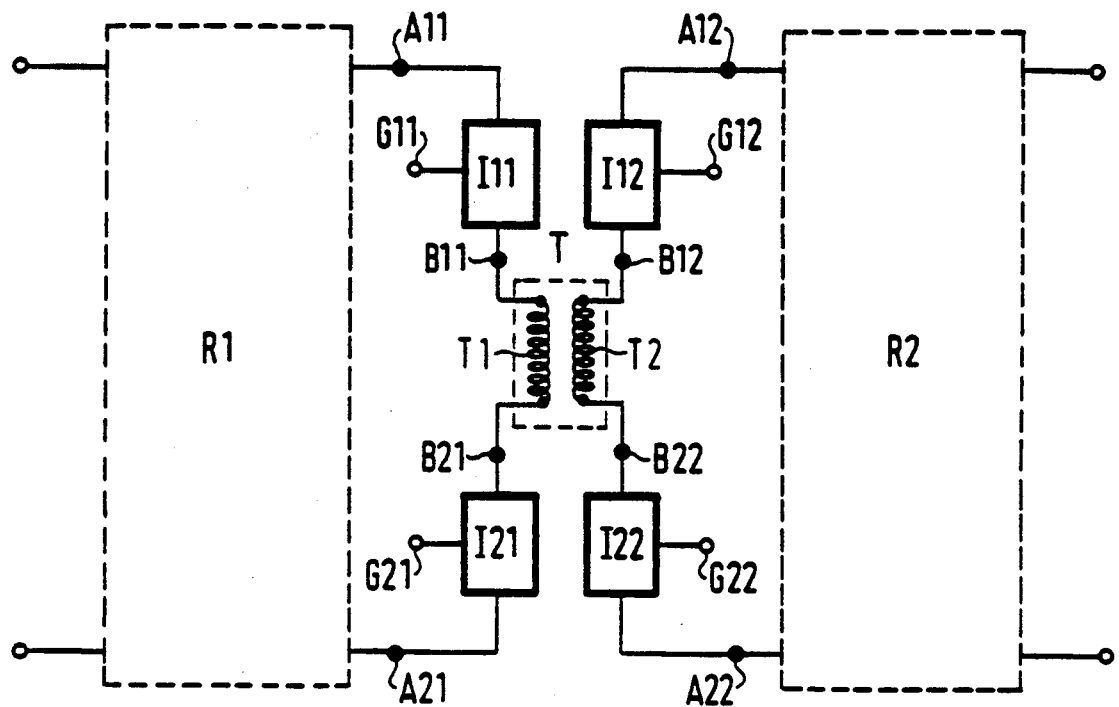
FIG. 19 shows a variant of the circuit diagrams of FIGS. 2 through 7 with reversible switches in the embodiment of FIGS. 9, 10, 12, 13 and 15 through 18.

The control strategy for the device so described therefore amounts to driving two electronic switches I1 and I2 at a frequency greater than twice the highest frequency to be transmitted contained in the incident signal, these electronic switches being controlled in phase or in phase opposition (depending on the process chosen) by means of a clock signal supplied by a clock H (FIG. 31) which includes the control components of the four half-switches I11, I21, I12, I22 disposed for example as shown in the FIG. 19 circuit diagram.

Figure 31:
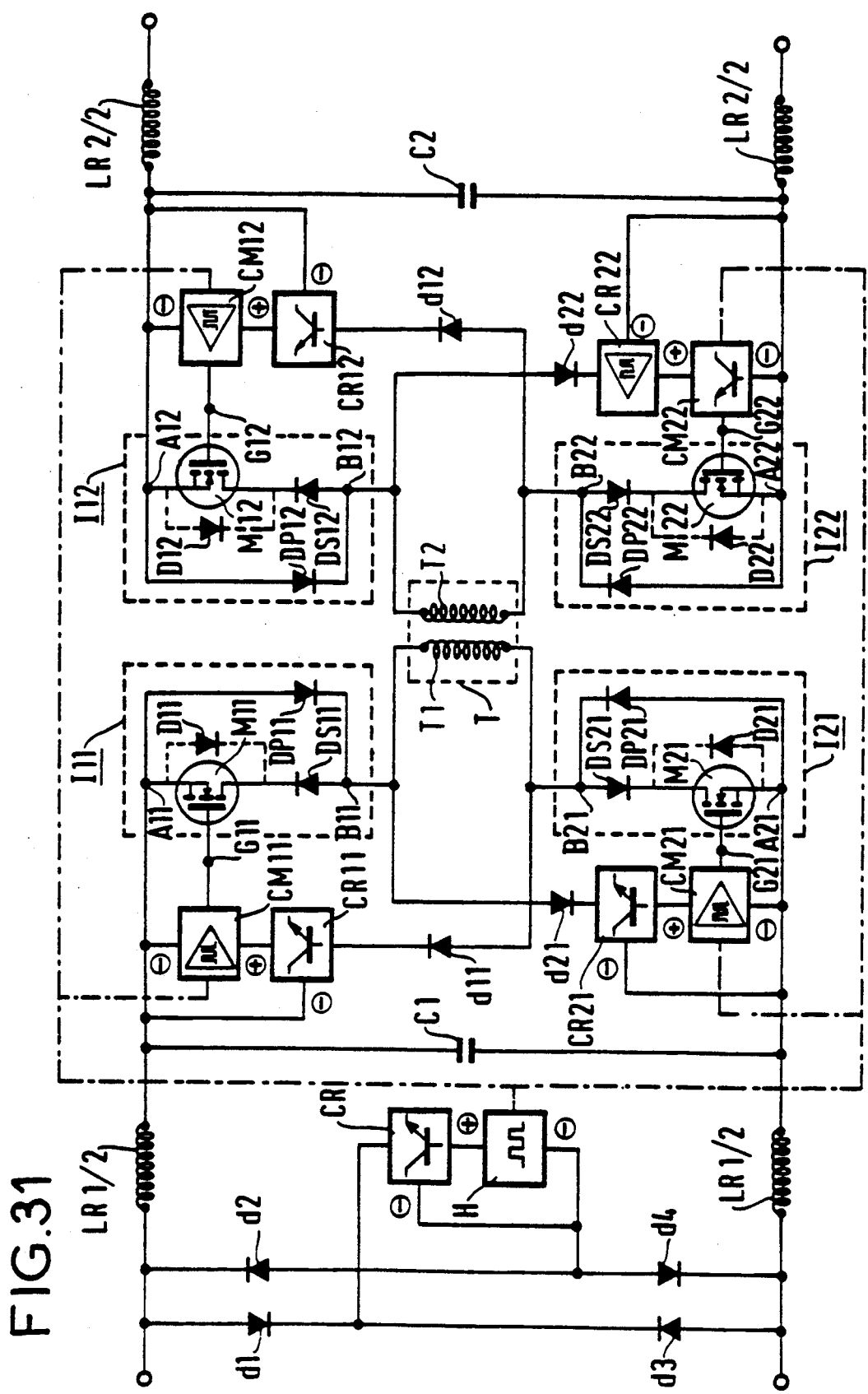
Figure 32:
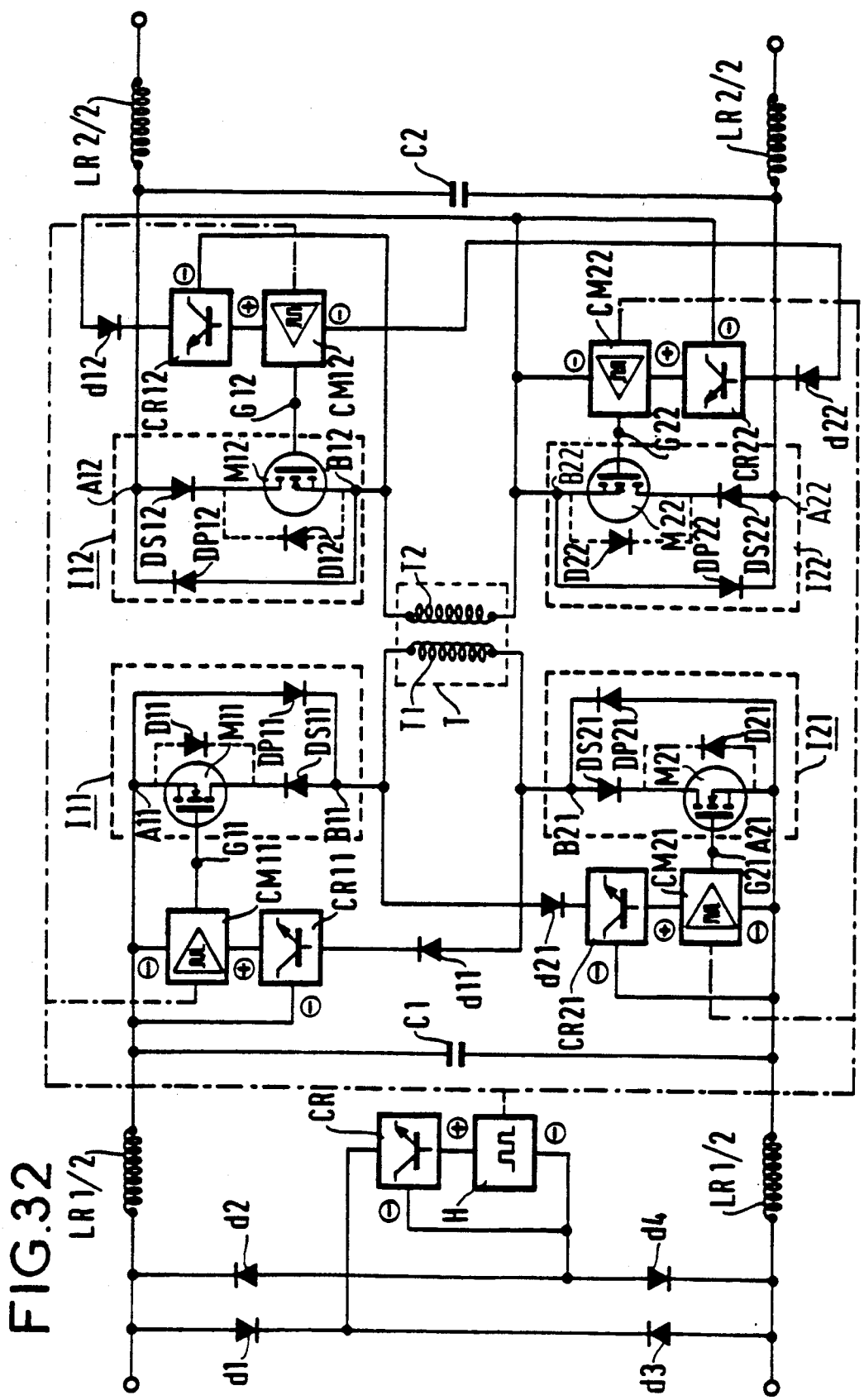

The FIGS. 31 and 32 circuit diagrams relate by way of example to a resonant forward converter using electronic switches comprising N-channel MOS transistors with a series arrangement (in this instance according to the FIG. 15 circuit diagram for all of the half-switches in the case of FIG. 31, and for the two half-switches switches I11 and I21 in the case of FIG. 32, the other half-switches I12 and I22 being in this instance disposed as shown in the FIG. 16 circuit diagram) and a clock supplied by the incident signal which is adapted to be inverted and without galvanic isolation. It is then sufficient to control four half-switches, that is to say four basic electronic switches, with the correct phase, maintaining galvanic isolation between the clock and each of the electronic half-switches.

In these circuit diagrams the clock H is supplied with the incident signal via a diode bridge d1, d2, d3, d4 and a regulator circuit CR and the control of the half-switches with galvanic isolation between the clock and each of the half-switches is symbolically represented by a dashed line.

Note that only the control circuits of the two half-switches on the other side of the transformer relative to the clock power feed must be able to withstand the same test potential as the main electrical insulation of the transformer. The other two electronic half-switches need only be isolated from the clock to the degree that the ability to invert the input polarity is used and to the degree that the clock power feed is not itself isolated from the signal. In this case, for example if the clock is supplied with power by the signal itself through a diode bridge, as in the FIGS. 31 or 32 circuit diagram, it is necessary to provide isolation between the clock and, depending on the circuit diagram adopted for the switch, each of the two half-switches (this is the case with FIGS. 31 and 32) or the set of the two half-switches, themselves at the same potential (as would be the case, for example with a switch circuit diagram like that of FIGS. 27 and 28). This isolation would have to be provided only for the maximum voltage of the signal itself, and therefore the differential voltage, and no longer for the maximum common mode voltage likely to appear between the two windings of the main transformer.

Figure 33:
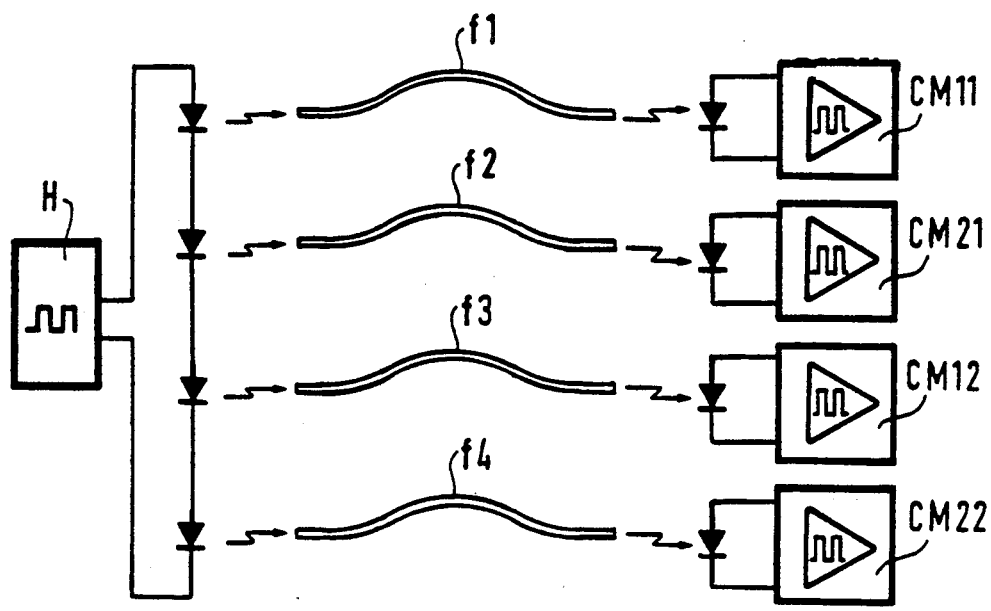
FIGS. 33 through 35 are possible embodiments of galvanic isolation for the control circuits of the half-switches, FIGS. 37 through 40 repeat the switch circuit diagrams from FIGS. 15 through 18 (FIG. 36 showing a complete switch symbolically) to which has been added means of detecting current in each of the half-switches, FIGS. 42 and 43 repeat the switch circuit diagrams from FIGS. 26 and 29 (FIG. 41 showing the switch symbolically) to which have been added means of detecting current in each of the half-switches, FIGS. 44 and 45 repeat the circuit diagrams of a galvanic isolation device in accordance with the invention from FIGS. 31 and 32 with added to them means for detecting current in each of the half-switches, in the manner of FIG. 37 for FIG. 44 and in the manner of FIGS. 37 and 38 for FIG. 45.
Figure 34:
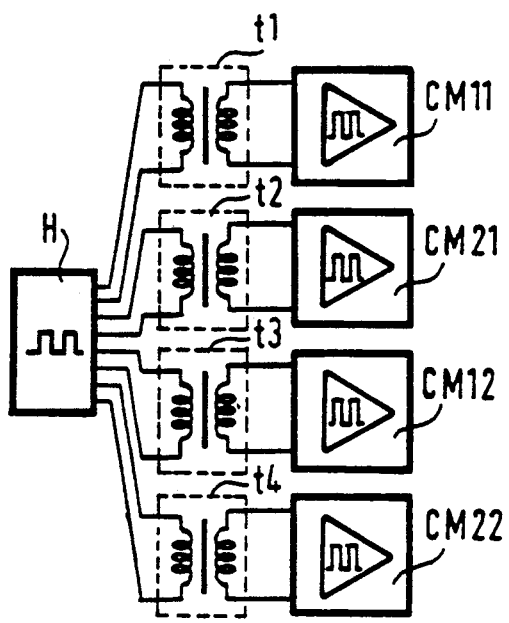
Figure 35:
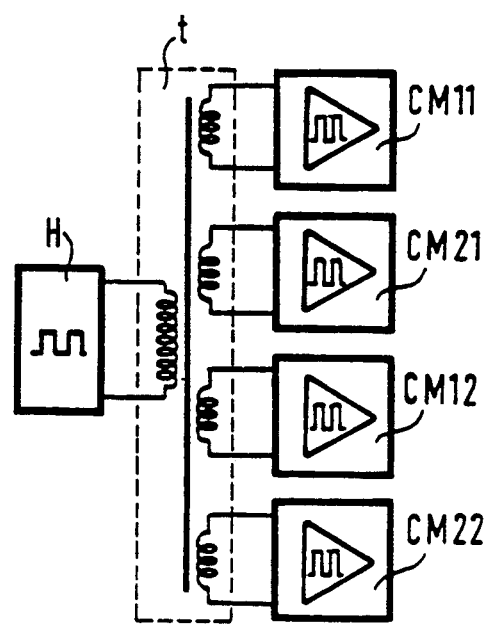

FIGS. 33, 34, 35 show respective modes of controlling the four half-switches using four optical fibres f1, f2, f3, f4, four pulse transformers t1, t2, t3, t4 and a single transformer t with one primary and four secondaries.

The clock signals received in this way for each of these half-switches are in this instance applied to their gate by means of control electronics comprising a respective pulse-shaping and amplifier circuits CM11, CM21, CM12, CM22, and a respective regulated power supply circuit CR11, CR21, CR12, CR22. Each regulated power supply circuit has a potential reference "−", an output "+" and a power input (not identified). Each pulse-shaping and amplifier circuit and the clock has a power input "+", a potential reference input "−" and an output (not identified).

In a circuit diagram like that of FIG. 31, which is the most complex example of electronic switch control, it is necessary to provide four power supplies for the electronics controlling the electronic half-switches.

Note that if pulse transformers are used, these can transmit sufficient power to control the half-switches directly with no other intermediary. In this case there is no need for local power supply or pulse amplification.

With optical control, half-switch control signal-shaping and amplification electronics are required and require a power supply.

The FIGS. 31 and 32 circuit diagrams show how to obtain the power from the signal itself if the use of an external supply is to be avoided. The power supply input of each of these pulse-shaping and amplifier circuits is connected by the associated regulator circuit to a respective diode d11, d21, d12, d22 in turn connected to one terminal of the respective winding of the main transformer T. Depending on the polarity of the signal the power is taken either directly from the signal itself or from the main transformer T (reverse overvoltages generated by the switch controlling the magnetizing current). In this latter case the magnetizing energy of the transformer T is recovered and used to supply power to the control pulse-shaping and amplifier electronic circuits, an additional effect of which is to limit the circuit opening overvoltages.

In the case of FIGS. 31 and 32, in particular, the two electronic half-switches of the same switch have to be controlled simultaneously although, depending on the external electrical conditions, only one will conduct to set the current direction. This strategy causes output from the power supply of the control circuits of the half-switch which is not conveying current, all of which power is lost.

This can be hazardous if these circuits are supplied with power by the signal or if a general requirement is for a high overall efficiency.

Figure 26:
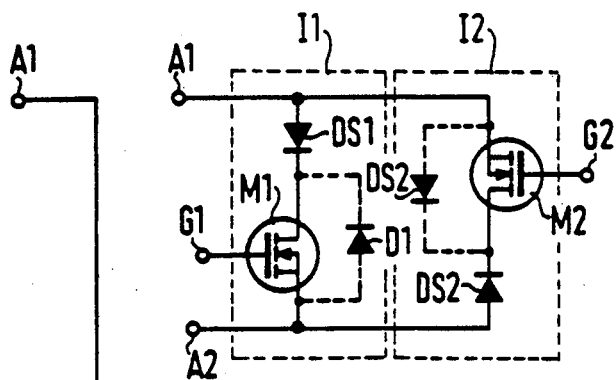
Figure 29:
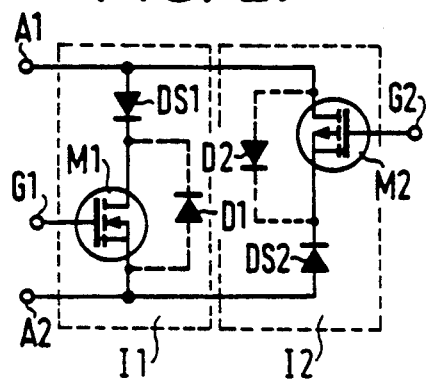
Figure 36:
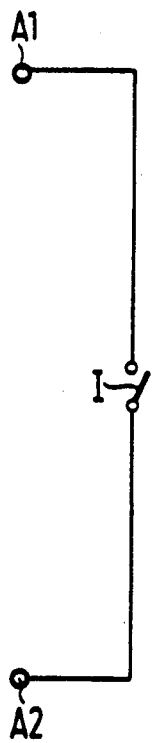
Figure 37:
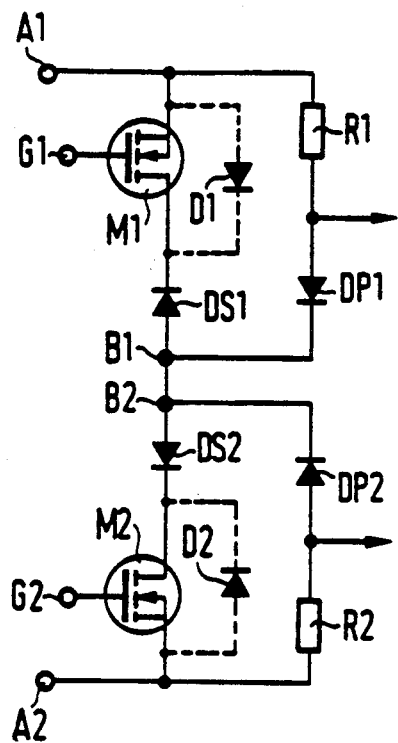
Figure 38:
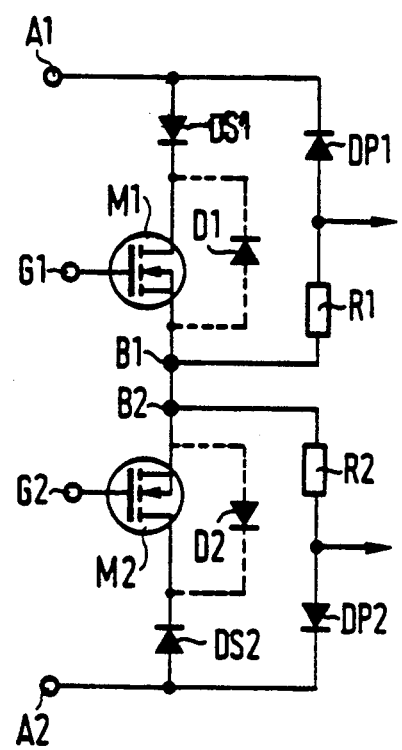
Figure 39:
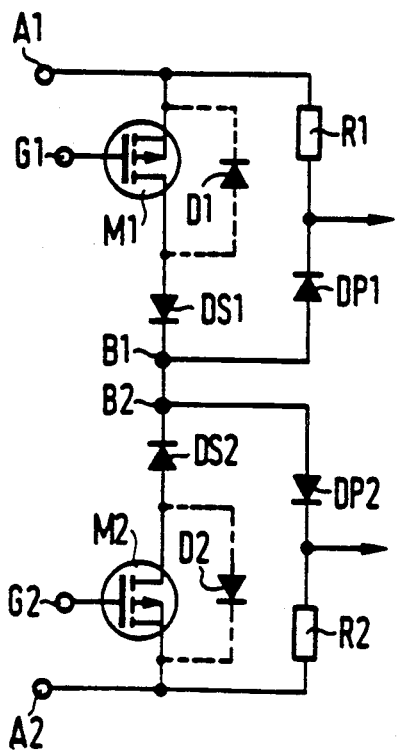
Figure 40:
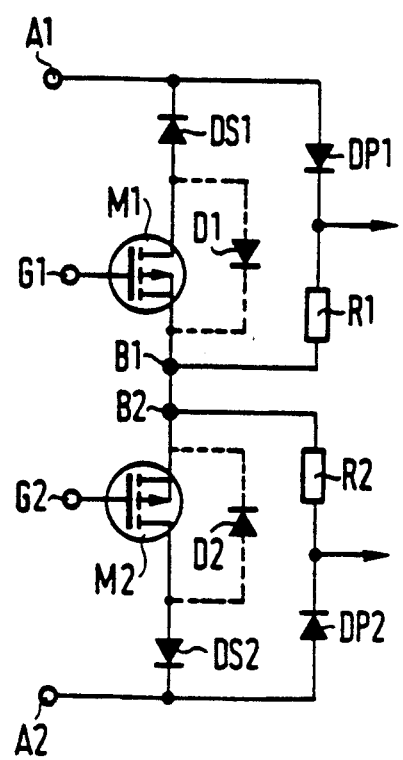
Figure 41:
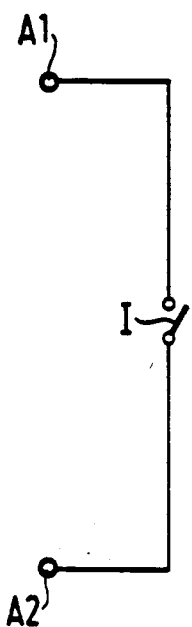
Figure 42:
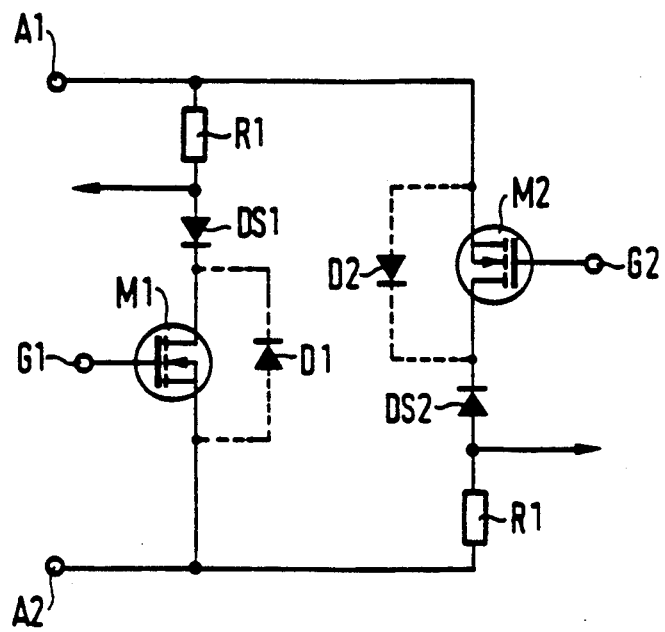
Figure 43:
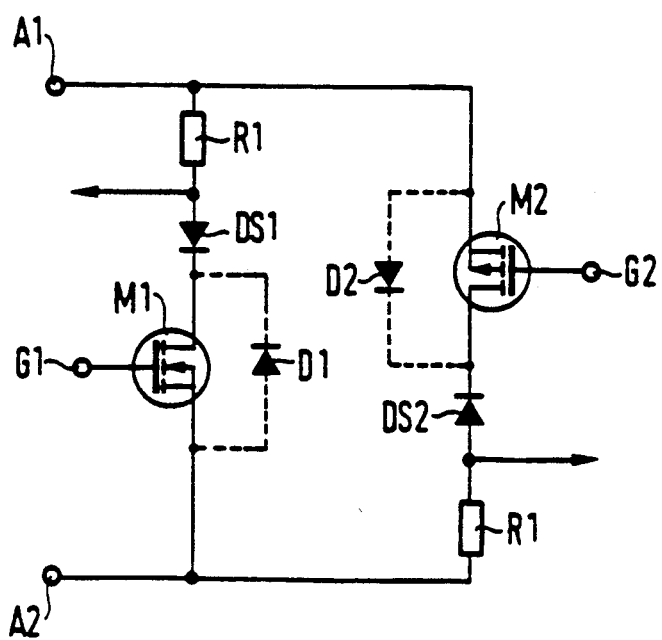

To avoid this the power supply and the operation of the control electronics of the half-switch which is not carrying any current can be disabled by sensing the current in the other half-switch or the reverse current in the diode connected in anti-parallel with the half-switch, using a simple resistor R1, R2 as shown by way of example in the FIGS. 37, 38, 39, 40 circuit diagrams for a switch symbolically represented in FIG. 36 and formed by two half-switches connected in series as in the FIGS. 15, 16, 17, 18 circuits, or in FIGS. 42 and 43 for a switch symbolically represented in FIG. 41 formed by two half-switches connected in anti-parallel, as in the FIGS. 26 and 29 circuits.

Figure 44:
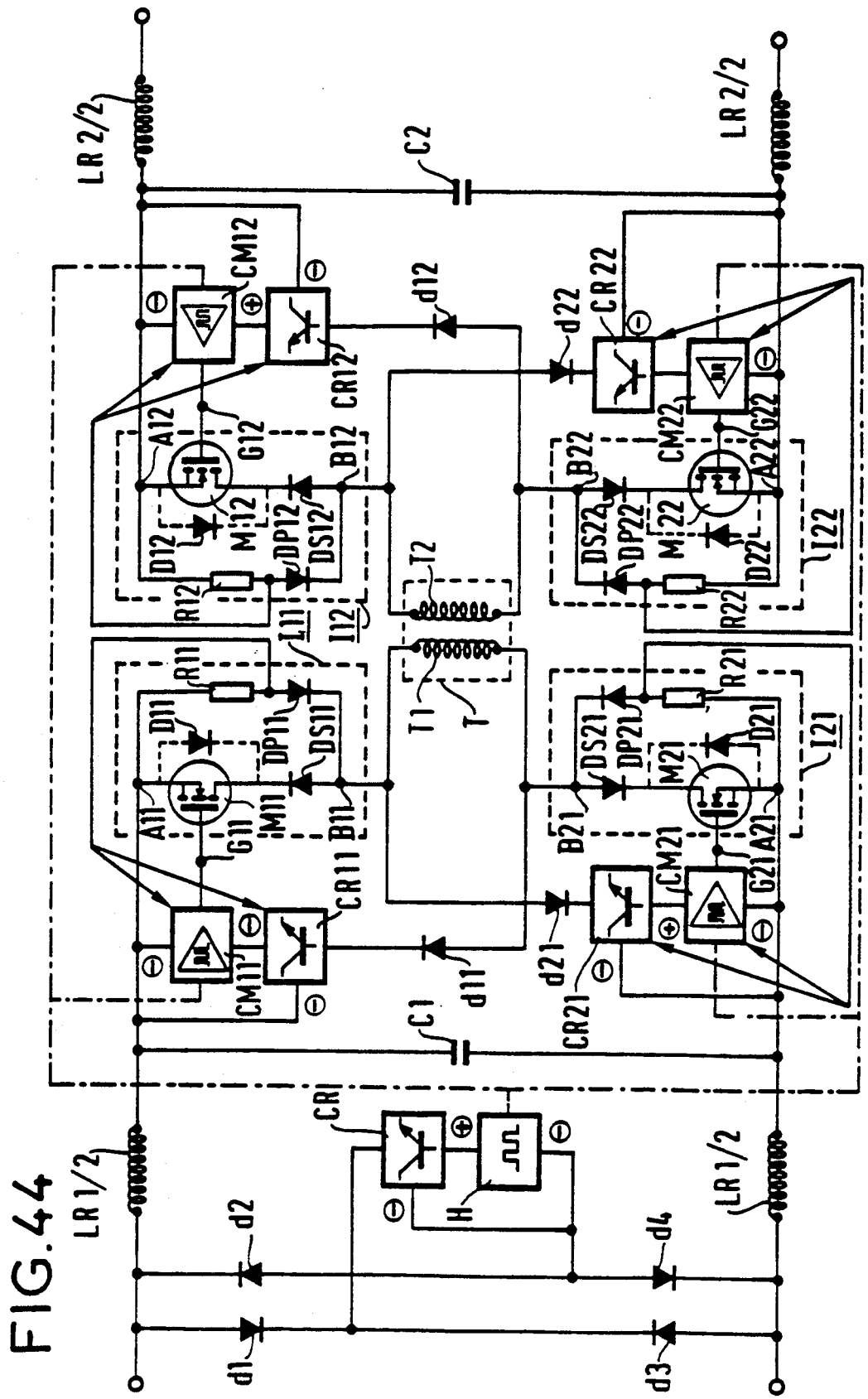
Figure 45:
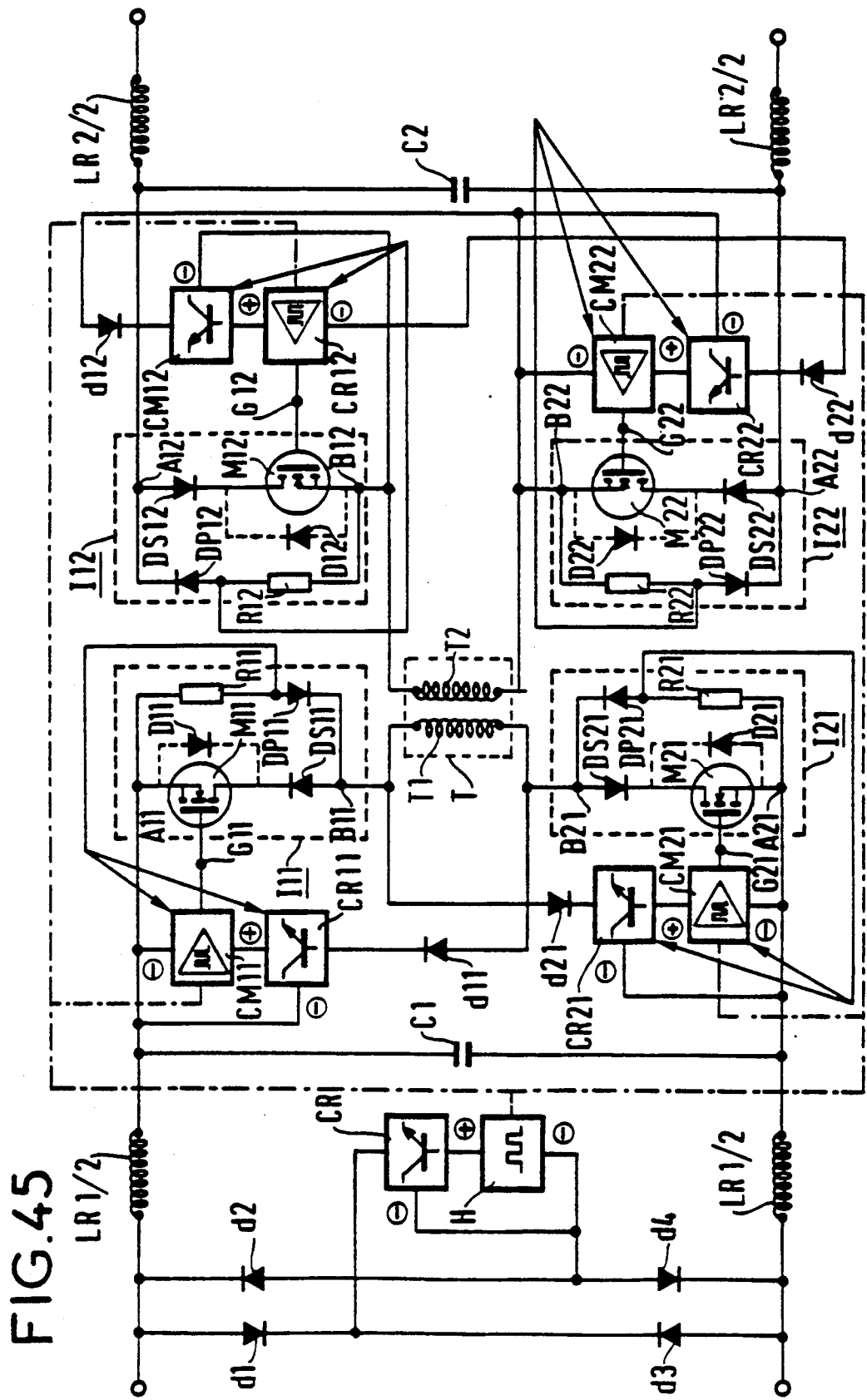

Similarly, the circuit diagrams of forward resonant converters using reversible electronic switches comprising N-channel MOS transistors with a series arrangement and a clock supplied with power by the signal, adapted to be reversed, with no galvanic isolation, with additionally a symmetrical arrangement relative to the conductors which convey the data, may be (for example) one of the FIGS. 44 and 45 circuit diagrams, which relate to those of FIGS. 31 and 32 and in which the detection of the reverse current in the respective half-switch by a respective resistor R11, R21, R12, R22 disables said half-switch because it is not able to conduct in the forward direction. In this case the regulated power supplies CRii (i=1 or 2) and the pulse amplifiers CMii (i=1 or 2) have an additional (arrowed) control input for disabling these two functions.

I claim:

1. A galvanic isolation device for one of direct current electrical signals and electrical signals likely to include a direct current component, said galvanic isolation device comprising:

a transformer having a first winding and a second winding, wherein signals having different polarities are applied across said first winding and said second winding, first reversible means, connected to said first winding of said transformer, for chopping said signals applied across said first winding of said transformer, said first reversible means being arranged for chopping said signals of different polarities, second reversible means, connected to said second winding of said transformer, for chopping said signals applied across said second winding of said transformer, said second reversible means being arranged for chopping said signals of different polarities, wherein said second reversible means is controlled in one of phase opposition with said first reversible means and in phase with said first reversible means, and first and second filter means for filtering signals obtained across said first winding and said second winding of said transformer, respectively, wherein said first reversible means and said second reversible means are arranged to provide for reversible operation of said galvanic isolation device.

2. The galvanic isolation device according to claim 1, wherein said galvanic isolation device is reversible in operation and comprises said first and said second reversible means and said first and said second filter means associated with said first and said second windings of said transformer, respectively.

3. The galvanic isolation device according to claim 1, wherein said signals comprise an alternating current component, and wherein said first and said second reversible means are controlled at a frequency more than twice a highest frequency to be transmitted in an input signal.

4. The galvanic isolation device according to claim 1, wherein each of the first and the second reversible means comprises semiconductor switches.

5. The galvanic isolation device according to claim 1, wherein each of said first and said second reversible means includes two basic semiconductor switches called half-switches which include internal parasitic diodes, wherein said half-switches are connected in series and have opposite conduction directions, a conduction direction for each of said half-switches of said first reversible means being identical to a conduction direction of the internal parasitic diodes of said half-switches of said second reversible means.

6. The galvanic isolation device according to claim 5, wherein for high operating frequencies, first and second diodes having required speed characteristics are associated with each of said half-switches respectively to eliminate operation of said internal parasitic diodes and to substitute for the operation of said internal parasitic diodes.

7. The galvanic isolation device according to claim 1, wherein each of said first and second reversible means includes two semiconductor basic switches called half-switches connected in anti-parallel having opposite conduction directions and each connected in series with a diode having a conduction direction opposite to that of said internal parasitic diode of a corresponding half-switch.

8. The galvanic isolation device according to claim 5, wherein said two semiconductor basic switches known as half-switches are connected each on one side of the transformer.

9. The galvanic isolation device according to claim 5, wherein control signals for said half-switches are derived from a common clock and applied to a control input of each of said half-switches via means for galvanically isolating an output signal of said common clock.

10. The galvanic isolation device according to claim 9, wherein said control signals of said half-switches are applied thereto via an electronic control means which operates an output signals of said common clock and specific to each of said half-switches, the half-switches having a local power supply applied to a reference terminal of each of said half-switches.

11. The galvanic isolation device according to claim 10, wherein said local power supply is obtained by taking energy from signals passing through the galvanic isolation device.

12. The galvanic isolation device according to claim 10, wherein said galvanic isolation device comprises means for disabling one of the power supply of said electronic control means and said electronic control means for that of tow of said half-switches which are not caused to conduct.

13. The galvanic isolation device according to claim 12, wherein said disabling means comprises means for detecting absence of current in said half-switches.

14. The galvanic isolation device according to claim 12, wherein said disabling means comprises means for detecting presence of current in an external diode which is substituted for the internal parasitic diode of said half-switch.

* * * * *